(12) United States Patent
Lee

(10) Patent No.: US 9,634,186 B2
(45) Date of Patent: Apr. 25, 2017

(54) METHOD OF MANUFACTURING LIGHT EMITTING DEVICE PACKAGE

(71) Applicant: SAMSUNG ELECTRONICS CO., LTD., Suwon-si, Gyeonggi-do (KR)

(72) Inventor: Jun Ho Lee, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/562,261

(22) Filed: Dec. 5, 2014

(65) Prior Publication Data

US 2015/0349201 A1 Dec. 3, 2015

(30) Foreign Application Priority Data

May 29, 2014 (KR) ........................ 10-2014-0065030

(51) Int. Cl.
| | |
|---|---|
| H01L 33/22 | (2010.01) |
| H01L 33/24 | (2010.01) |
| H01L 33/30 | (2010.01) |
| H01L 33/38 | (2010.01) |
| H01L 33/00 | (2010.01) |
| H01L 33/50 | (2010.01) |

(Continued)

(52) U.S. Cl.
CPC .......... *H01L 33/22* (2013.01); *H01L 33/0079* (2013.01); *H01L 33/24* (2013.01); *H01L 33/30* (2013.01); *H01L 33/382* (2013.01); *H01L 33/486* (2013.01); *H01L 33/505* (2013.01); *H01L 33/58* (2013.01); *H01L 2933/0016* (2013.01); *H01L 2933/0041* (2013.01); *H01L 2933/0058* (2013.01)

(58) Field of Classification Search
CPC ..... H01L 33/22; H01L 33/24; H01L 33/0079; H01L 33/486; H01L 2933/0016; H01L 2933/0058; H01L 33/505; H01L 33/30; H01L 33/382; H01L 2933/0041; H01L 33/58; H01L 33/48601
USPC .............................................. 438/22; 257/79
See application file for complete search history.

(56) References Cited

U.S. PATENT DOCUMENTS

| | | |
|---|---|---|
| 6,248,667 B1 | 6/2001 | Kim et al. |
| 6,372,608 B1 | 4/2002 | Shimoda et al. |
| 6,645,830 B2 | 11/2003 | Shimoda et al. |

(Continued)

FOREIGN PATENT DOCUMENTS

| | | |
|---|---|---|
| JP | 4140595 B2 | 8/2008 |
| KR | 2000-0060667 A | 10/2000 |

(Continued)

*Primary Examiner* — Long K Tran
*Assistant Examiner* — Thai T Vuong
(74) *Attorney, Agent, or Firm* — Lee & Morse, P.C.

(57) ABSTRACT

A method of manufacturing a light emitting device package includes forming on a growth substrate a light emitting structure including a first conductivity-type semiconductor layer, an active layer, and a second conductivity-type semiconductor layer. First and second electrodes are formed on the light emitting structure to be connected to the first and second conductivity-type semiconductor layers, respectively. A first bonding layer is formed on the light emitting structure, and is polished A second bonding layer is formed on the polished first bonding layer, and a support substrate is bonded to the light emitting structure using the first and second bonding layers.

19 Claims, 17 Drawing Sheets

(51) Int. Cl.
  *H01L 33/58*  (2010.01)
  *H01L 33/48*  (2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,841,274 B2 | 1/2005 | Ueno et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,061,026 B2 | 6/2006 | Huang |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,984 B2 | 9/2012 | Faure |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,481,411 B2 | 7/2013 | Sakai |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2011/0233587 A1* | 9/2011 | Unno .................... H01L 33/382 |
| | | 257/98 |
| 2012/0068215 A1* | 3/2012 | Lee .......................... H01L 33/22 |
| | | 257/98 |
| 2012/0118226 A1 | 5/2012 | Fujiwara et al. |
| 2012/0135549 A1 | 5/2012 | Nakayama et al. |
| 2012/0138988 A1* | 6/2012 | Lee .......................... H01L 33/62 |
| | | 257/98 |
| 2012/0282443 A1* | 11/2012 | Fujito .................... C30B 25/18 |
| | | 428/174 |

FOREIGN PATENT DOCUMENTS

| | | |
|---|---|---|
| KR | 10-2004-0079884 A | 9/2004 |
| KR | 10-2011-0049255 A | 5/2011 |
| KR | 10-1157426 B1 | 6/2012 |

\* cited by examiner

METHOD OF MANUFACTURING LIGHT EMITTING DEVICE PACKAGE

CROSS-REFERENCE TO RELATED APPLICATION

This application claims priority under 35 U.S.C. §119 to Korean Patent Application No. 10-2014-0065030 filed on May 29, 2014, with the Korean Intellectual Property Office, the entire disclosure of which is incorporated herein by reference.

BACKGROUND

The present disclosure relates to a method of manufacturing a light emitting device package.

Light emitting diodes (LEDs) are commonly used as light sources due to various advantages thereof, such as low power consumption, high luminance, and the like. In particular, light emitting devices have recently been employed as backlights in lighting devices and large liquid crystal displays (LCDs). Such light emitting devices are provided as packages that may be easily installed in various devices such as lighting devices, and the like.

In a light emitting device package manufacturing process, light emitting structures may be grown on a growth substrate and may be bonded to a support substrate for post-processing. In general, the support substrate may be bonded by coating a bonding surface thereof with an organic compound and applying uniform pressure thereto under heating conditions.

SUMMARY

An aspect of the present disclosure may provide a method of manufacturing a light emitting device package capable of suppressing the generation of a non-bonded region at the time of bonding a light emitting structure and a support substrate, and accordingly, production yield may be improved in a subsequent packaging process.

According to an aspect of the present disclosure, a method includes forming a first bonding layer on a non-planar surface of a light emitting structure including a first conductivity-type semiconductor layer, an active layer, and a second conductivity-type semiconductor layer; planarizing a surface of the first bonding layer; and forming a second bonding layer on the first bonding layer to cover the first bonding layer.

The step of planarizing the surface of the first bonding layer may include planarizing the surface of the first bonding layer to expose at least a portion of the non-planar surface of the light emitting structure through the planarized surface of the first bonding layer, and the step of forming the second bonding layer may include forming the second bonding layer on the planarized surface of the first bonding layer to cover the first bonding layer and the exposed portion of the non-planar surface of the light emitting structure.

The method may further include planarizing a surface of the second bonding layer, where no portion of the light emitting structure is exposed through the planarized surface of the second bonding layer.

The method may further include planarizing a surface of the second bonding layer and, upon determining that the planarized surface of the second bonding layer is non-planar, forming a third bonding layer on the planarized surface of the second bonding layer to fill irregularities in the surface of the second bonding layer.

The step of planarizing the surface of the first bonding layer may include polishing the surface of the first bonding layer through chemical mechanical polishing (CMP).

The method may further include bonding a support substrate to the second bonding layer and, following the step of bonding the support substrate, removing a growth substrate attached to the light emitting structure.

The method may further include forming one or more through holes to penetrate through the support substrate and the first and second bonding layers, forming an insulating layer to extend from perimeters of the through holes to a lower surface of the support substrate in the through holes, and applying a conductive material to the insulating layer extending in the through holes to form an electrical connection to the first or second conductivity-type semiconductor layer.

The method may further include forming a wavelength conversion layer on the second conductivity-type semiconductor layer of the light emitting structure, and forming a lens part on the wavelength conversion layer, where the lens part has a first surface contacting the wavelength conversion layer and a second surface that is opposite to the first surface and is convex.

According to another aspect of the present disclosure, a method includes forming a first bonding layer on a light emitting structure including a first conductivity-type semiconductor layer, an active layer, and a second conductivity-type semiconductor layer; planarizing a surface of the first bonding layer; and forming a second bonding layer on the planarized surface of the first bonding layer to cover the first bonding layer.

A surface of the light emitting structure having the first bonding layer formed thereon may have irregularities, and the first bonding layer may fill the irregularities in the surface of the light emitting structure.

The irregularities may include at least one of an overgrowth region of the light emitting structure, a protrusion in the surface of the light emitting structure, and a recess in the surface of the light emitting structure.

The step of planarizing the surface of the first bonding layer may include planarizing the surface to expose at least one irregularity in the surface of the light emitting structure, and the step of forming the second bonding layer may include forming the second bonding layer on the first bonding layer to cover the first bonding layer and the exposed irregularity in the light emitting structure.

A growth substrate having the light emitting structure thereon may be warped. The step of forming the first bonding layer may include forming the first bonding layer to have a first surface contacting a warped surface of the light emitting structure, and the step of planarizing the first bonding layer may include planarizing a second surface of the first bonding layer opposite to the first surface to have a substantially flat surface.

The method may further include forming one or more conductive electrodes on a surface of the light emitting structure prior to forming the first and second bonding layers, where the step of forming the first bonding layer may include forming the first bonding layer on the surface of the light emitting structure having the conductive electrodes.

The method may further include bonding a support substrate to the second bonding layer; forming one or more through holes to penetrate through the support substrate and the first and second bonding layers at locations of the one or more conductive electrodes; forming an insulating layer to extend from perimeters of the through holes to a lower surface of the support substrate in the through holes; and applying a conductive material to the insulating layer extending in the through holes to form electrical connections to the one or more conductive electrodes.

The second bonding layers may be formed of a same material as the first bonding layer.

The second bonding layer may be formed of a different material than the first bonding layer.

According to another aspect of the present disclosure, a light emitting device package includes a light emitting structure including a first conductivity-type semiconductor layer, an active layer, and a second conductivity-type semiconductor layer, the light emitting structure having a non-planar surface; a first bonding layer disposed on the non-planar surface of the light emitting structure, where the first bonding layer has a non-planar surface contacting the non-planar surface of the light emitting structure; and a second bonding layer disposed on the first bonding layer.

The first bonding layer may have a planar surface opposite to the non-planar surface, and the second bonding layer may be disposed on the planar surface of the first bonding layer.

The planar surface of the first bonding layer may be coplanar with a surface of an irregularity in the non-planar surface of the light emitting structure, and the second bonding layer may be disposed on the planar surface of the first bonding layer and on the coplanar surface of the irregularity in the light emitting structure.

The first bonding layer may be formed of a silicon oxide or a silicon nitride, and the second bonding layer may be formed of a same material as the first bonding layer.

The second bonding layer may be formed of a different material than the first bonding layer.

The light emitting device package may further include a support substrate bonded to the second bonding layer.

The light emitting device package may further include a through hole penetrating through the support substrate and the first and second bonding layers; an insulating layer disposed on a surface of the through hole to extend from a perimeter of the through hole to a lower surface of the support substrate in the through hole; and a conductive electrode disposed on the insulating layer extending in the through hole to form an electrical connection to the first or second conductivity-type semiconductor layer.

The light emitting device package may further includes a wavelength conversion layer disposed on the second conductivity-type semiconductor layer of the light emitting structure; and a lens part disposed on the wavelength conversion layer, where the lens part has a first surface contacting the wavelength conversion layer and a second surface that is opposite to the first surface and is convex.

According to another aspect of the present disclosure, a light emitting device package includes a light emitting structure including a first conductivity-type semiconductor layer, an active layer, and a second conductivity-type semiconductor layer; a first bonding layer disposed on the light emitting structure; and a second bonding layer disposed on the first bonding layer.

A surface of the light emitting structure having the first bonding layer disposed thereon may have irregularities, and the first bonding layer may fill the irregularities in the surface of the light emitting structure.

The surface of the light emitting structure having the first bonding layer disposed thereon may be bowed, and a first surface of the first bonding layer may contact the light emitting structure, and a second surface of the first bonding layer that is opposite to the first surface may be substantially planar.

One or more irregularities in the surface of the light emitting structure may extend through the first bonding layer, and the second bonding layer may be disposed on the first bonding layer so as to contact the one or more irregularities in the surface of the light emitting structure that extend through the first bonding layer.

The light emitting device package may further include a third bonding layer disposed on the second bonding layer.

The second bonding layer may have a first non-planar surface contacting the first bonding layer and a second non-planar surface opposite to the first non-planar surface, and the third bonding layer may be disposed on the second non-planar surface of the second bonding layer.

The light emitting device package may further include one or more conductive electrodes disposed on a surface of the light emitting structure contacting the first bonding layer.

The light emitting device package may further include a support substrate bonded to the second bonding layer; a through hole penetrating through the support substrate and the first and second bonding layers at a location of one of the conductive electrodes; an insulating layer disposed on a surface of the through hole to extend from a perimeter of the through hole to a lower surface of the support substrate in the through hole; and a conductive electrode disposed on the insulating layer extending in the through hole to form an electrical connection to the one of the conductive electrodes.

According to another embodiment, a method of manufacturing a light emitting device package may include: forming a light emitting structure on a growth substrate, the light emitting structure including a first conductivity-type semiconductor layer, an active layer, and a second conductivity-type semiconductor layer; forming first and second electrodes on the light emitting structure to be connected to the first and second conductivity-type semiconductor layers, respectively; forming a first bonding layer on the light emitting structure; polishing the first bonding layer; forming a second bonding layer on the polished first bonding layer; and bonding a support substrate to the light emitting structure using the first and second bonding layers.

The method may further include polishing the second bonding layer before bonding the support substrate to the light emitting structure.

In the forming of the light emitting structure, an upper surface of the light emitting structure may include a non-planar region.

The non-planar region may be higher than the remainder of the upper surface of the light emitting structure.

A portion of the non-planar region may be exposed through the first bonding layer after polishing the first bonding layer.

The polished first bonding layer may have a flat upper surface, and the exposed portion of the non-planar region may be substantially coplanar with the upper surface of the first bonding layer.

The method may further include polishing the second bonding layer to flatten an upper surface thereof without exposing the non-planar region before bonding the support substrate to the light emitting structure, wherein the forming of the second bonding layer may be performed by covering the exposed portion of the non-planar region.

The non-planar region may be disposed at an edge of the light emitting structure after forming the light emitting structure.

The non-planar region may include a plurality of protrusions formed on the upper surface of the light emitting structure after forming the light emitting structure.

The growth substrate, on which the light emitting structure is formed, may be warped.

The non-planar region may include a recess formed in the upper surface of the light emitting structure.

The method may further include polishing the second bonding layer to flatten an upper surface thereof before bonding the support substrate to the light emitting structure, wherein a portion of an upper surface of the first bonding layer corresponding to the recess may be recessed after polishing the first bonding layer.

The method may further include: forming a third bonding layer on the polished second bonding layer before bonding the support substrate to the light emitting structure; and polishing the third bonding layer.

The method may further include: forming first and second through holes penetrating through the support substrate to be connected to the first and second electrodes, respectively; and connecting the first and second electrodes to first and second electrode pads through the first and second through holes, respectively.

According to another aspect of the present disclosure, a method of manufacturing a light emitting device package may include: forming a light emitting structure on a growth substrate, the light emitting structure including a non-planar region formed on an upper surface thereof; forming a first bonding layer on the upper surface of the light emitting structure; polishing the first bonding layer until a portion of the non-planar region is exposed through an upper surface of the first bonding layer; forming a second bonding layer on the polished first bonding layer; polishing the second bonding layer to flatten an upper surface thereof; and bonding a support substrate to the polished second bonding layer.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1A:
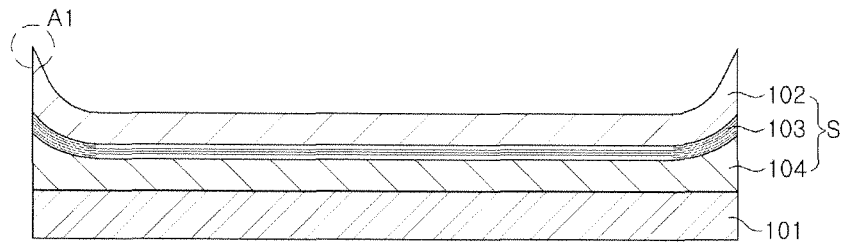
FIGS. 1A through 1I are views illustrating a method of manufacturing a light emitting device package according to an exemplary embodiment in the present disclosure.

Exemplary embodiments in the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements may be exaggerated for clarity, and the same reference numerals will be used throughout to designate the same or like elements.

In the present specification, positional terms such as "on (above)," "upper surface," "below," "lower surface," "higher," "lower," and the like, are determined based on the positions and orientations of devices and elements as they are depicted in the drawings. In actuality, the positional terms more generally refer to the positions and orientations of the devices and elements relative to each other, and the terms may be understood to more generally cover embodiments in which a direction in which a light emitting device is disposed is different than that shown in the drawings.

FIGS. 1A through 1I are views illustrating a method of manufacturing a light emitting device package according to an exemplary embodiment in the present disclosure. The method is illustrated on the basis of manufacturing processes on a wafer level, but is not limited thereto.

With reference to FIG. 1A, a light emitting structure S including a second conductivity-type semiconductor layer 104, an active layer 103, and a first conductivity-type semiconductor layer 102 may be formed on a growth substrate 101. An upper surface of the light emitting structure S may include a non-planar region which has one or more irregularities, and is not in parallel to a lower to surface of the growth substrate 101.

The non-planar region may include an irregularity or region higher than the remainder of the upper surface of the light emitting structure S. In a case in which the growth substrate 101 is a semiconductor wafer, the non-planar region may be an overgrowth region A1 of the light emitting structure S at an edge of the wafer.

The light emitting structure S may be formed on the growth substrate 101 using metal organic chemical vapor deposition (MOCVD), hydride vapor phase epitaxy (HVPE), molecular beam epitaxy (MBE), or the like. The second conductivity-type semiconductor layer 104, the active layer 103, and the first conductivity-type semiconductor layer 102 may be sequentially stacked on the growth substrate 101.

The growth substrate 101 may be formed of an insulating, conductive, or semiconductor material, such as sapphire, SiC, $MgAl_2O_4$, MgO, $LiAlO_2$, $LiGaO_2$, GaN, or the like. In a case of a sapphire substrate commonly used as a nitride semiconductor growth substrate, a crystal having Hexa-Rhombo R3c symmetry, the sapphire substrate has a lattice constant of 13.001 Å along a C-axis and a lattice constant of 4.758 Å along an A-axis and includes a C (0001) plane, an A (11-20) plane, an R (1-102) plane, and the like. The C plane is mainly used as a substrate for nitride semiconductor growth because it facilitates the growth of a nitride film and is stable at high temperatures. Meanwhile, an Si substrate may also be appropriately used as the growth substrate 101. The Si substrate may be easily formed to have a large diameter and may be relatively inexpensive, whereby production yield may be improved. In a case of using the Si substrate, a nucleation layer formed of $Al_xGa_{1-x}N$ ($0 \leq x \leq 1$) or the like may be formed on the growth substrate 101 and a nitride semiconductor having a desired structure may be grown thereon.

The first and second conductivity-type semiconductor layers 102 and 104 forming the light emitting structure S may be p-type and n-type semiconductors, respectively, but are not limited thereto. Alternatively, the first and second conductivity-type semiconductor layers 102 and 104 may be n-type and p-type semiconductors, respectively. The first and second conductivity-type semiconductor layers 102 and 104 may be formed of a nitride semiconductor, for example, a material having a composition $Al_xIn_yGa_{1-x-y}N$ ($0 \leq x \leq 1$, $0 \leq y \leq 1$ and $0 \leq x+y \leq 1$), and each of which may be formed of a single layer, or a plurality of layers having different characteristics in terms of doping concentration, composition, and the like.

However, the first and second conductivity-type semiconductor layers 102 and 104 may be formed of AlInGaP- or AlInGaAs-based semiconductor as well as the nitride semiconductor. The active layer 103 disposed between the first conductivity-type semiconductor layer 102 and the second conductivity-type semiconductor layer 104 may emit light having a predetermined level of energy through electron-hole recombination, and may have a multiple quantum well (MQW) structure in which quantum barrier layers and quantum well layers are alternately stacked. For example, in a case of a nitride semiconductor, a GaN/InGaN structure may be used. However, a single quantum well (SQW) structure may also be used.

For example, the first conductivity-type semiconductor layer 102 may include an electron blocking layer and a p-electrode having a higher content of Al than a content of In in order to prevent electrons in the active layer 103 from passing therethrough, and a p-layer having a Mg doping level of $1 \times 10E19$ $cm^{-3}$ or higher in order to inject holes. For example, the second conductivity-type semiconductor layer 104 may include a high resistance layer having an Si doping level of $1 \times 10E18$ $cm^{-3}$ or lower in order to improve crystalline properties and reduce leakage currents, a crystallinity improving layer including Al, an electrode forming layer having an Si doping level of $1 \times 10E19$ $cm^{-3}$ or higher in order to form an n-electrode and improve electron injection efficiency, and a current diffusion layer having a higher content of In than a content of Al in order to increase the crystalline properties of the active layer 103 and have the current spreading effect.

Figure 1B:
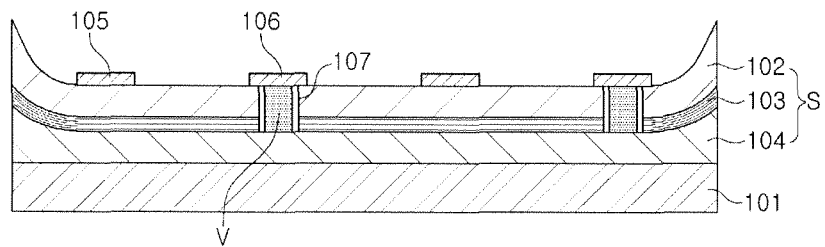
Figure 1C:
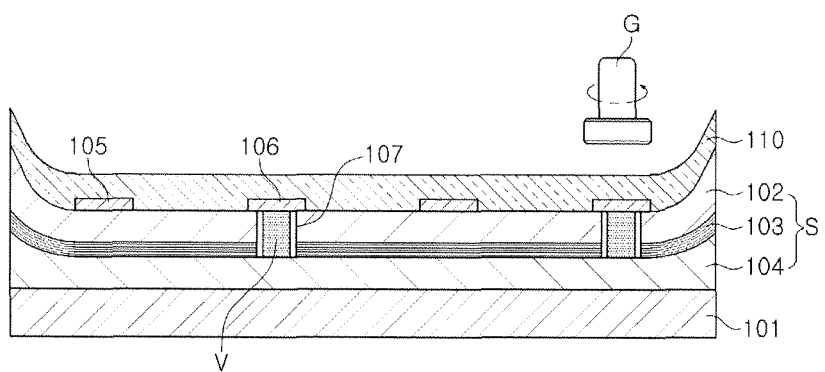

With reference to FIG. 1B, first and second electrodes 105 and 106 may be formed by depositing a conductive material on the upper surface of the light emitting structure S.

The first and second electrodes 105 and 106 may be formed of a conductive material. For example, the first and second electrodes 105 and 106 may be formed of at least one of Ag, Al, Ni, Cr, and the like. In the present exemplary embodiment, the second electrode 106 may include a via V passing through the first conductivity-type semiconductor layer 102 and the active layer 103 and electrically connecting the second electrode 106 to the second conductivity-type semiconductor layer 104. In order to form the via V, a via hole may be formed by an etching process. A first insulting layer 107 may be deposited on the perimeter of the via hole so as to electrically insulate the second electrode 106 from the first conductivity-type semiconductor layer 102 and the active layer 103. Accordingly, the first and second electrodes 105 and 106 may be electrically connected to the first and second conductivity-type semiconductor layers 102 and 104, respectively.

With reference to FIG. 10, a first bonding layer 110 may be formed on the upper surface of the light emitting structure S on which the first and second electrodes 105 and 106 are formed. The first bonding layer 110 may be formed to have a shape corresponding to that of the upper surface of the light emitting structure S.

The first bonding layer 110 may be formed of a material having electrical insulating properties, for example, a silicon oxide or a silicon nitride such as $SiO_2$, $SiO_xN_y$, $Si_xN_y$, tetraethyl orthosilicate (TEOS), or the like. In addition, a second bonding layer 111 and a third bonding layer 112 to be described below may also be formed of the aforementioned material. The first, second, and third bonding layers 110, 111, and 112 may be formed of a same material as each other, or may alternatively be formed of different materials than each other.

The bonding layers may be formed using thermal chemical vapor deposition, plasma enhanced chemical vapor deposition (PECVD), or high density plasma chemical vapor deposition (HDP CVD).

Next, a polishing process for planarization may be performed on the first bonding layer 110. The polishing process may be performed through chemical mechanical polishing (CMP) using a polishing machine G. Polishing processes to be described below may also be performed in the same manner.

Figure 1D:
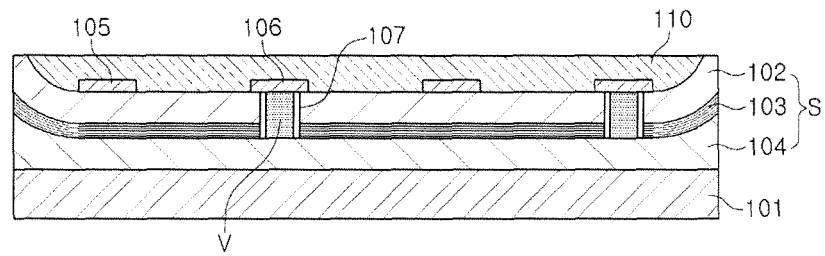

With reference to FIG. 1D, after the polishing of the first bonding layer 110, a portion of the non-planar region may be exposed outside the first bonding layer 110. Here, the polished first bonding layer 110 may have a flat upper surface, and the exposed portion of the non-planar region may be substantially coplanar with the upper surface of the first bonding layer 110. The exposed portion of the non-planar region may become a non-bonded portion in a subsequent process, thereby forming a void. Such a void region may be removed due to a risk such as an explosion or the like, resulting in a reduction in a production yield of light emitting device packages by an amount corresponding to an area of the removed region.

In addition, after the polishing of the first bonding layer 110, the first bonding layer 110 may cover the entirety of the upper surface of the light emitting structure S without exposing the non-planar region outside the first bonding layer 110.

Figure 1E:
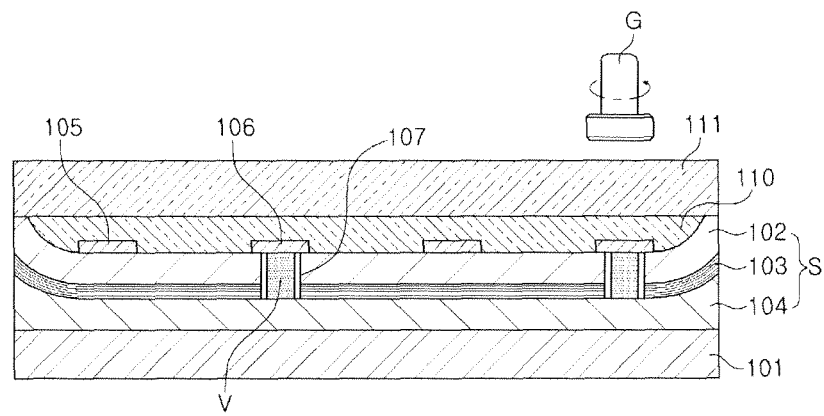

With reference to FIG. 1E, a second bonding layer 111 may be formed on the polished first bonding layer 110 to cover the exposed portion of the non-planar region. Next, the second bonding layer 111 may be polished to flatten an upper surface thereof while allowing the portion of the non-planar region exposed in polishing the first bonding layer 110 not to be exposed.

Figure 1F:
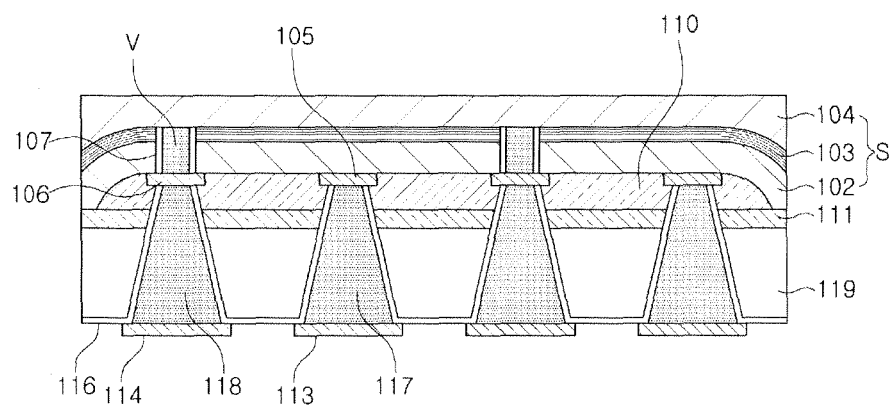

With reference to FIG. 1F, the growth substrate 101 may be removed, and the light emitting structure S on which the first and second bonding layers 110 and 111 are formed may be bonded to a support substrate 119 by the second bonding layer 111.

The growth substrate 101 may be removed through laser irradiation in a laser lift off process, but the removal thereof is not limited thereto. The growth substrate 101 may be removed using various methods.

The support substrate 119 may serve as a support for the light emitting structure S in subsequent processes. The support substrate 119 is not particularly limited, but a substrate formed of Si, GaAs, GaP, AlGaInP, Ge, SiSe, GaN, AlInGaN, InGaN, or the like, may be used therefor. Alternatively, a substrate formed of Al, Zn, Ag, W, Ti, Ni, Au, Mo, Pt, Pd, Cu, Cr, Fe, or an alloy thereof may be used.

A connection may be made by filling first and second through holes 117 and 118 etched to penetrate through the support substrate 119 and the first and second bonding layers 110 and 111 with a metal or a conductive material, or by plating.

A second insulating layer 116 may be formed to extend from the perimeters of the first and second through holes 117 and 118 to a lower surface of the support substrate 119. The second insulating layer 116 may electrically insulate the first and second electrodes 105 and 106, the metal or conductive material filling the through holes 117 and 118, and the first and second electrode pads 113 and 114 from the support substrate 119.

Figure 1G:
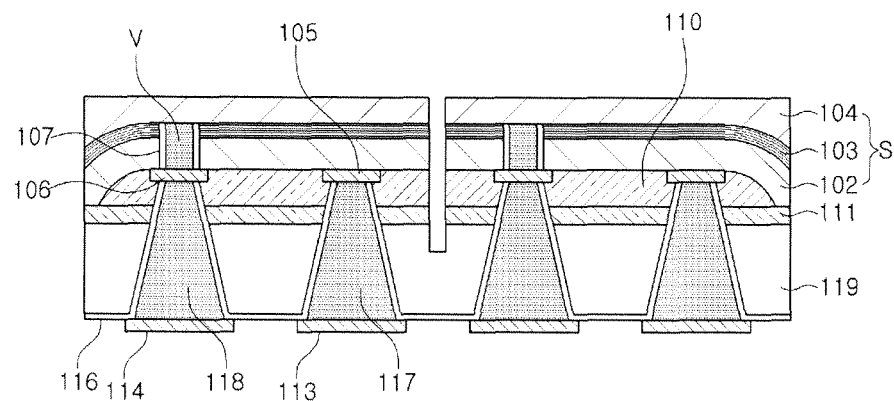

With reference to FIG. 1G, a trench may be formed to isolate devices from one another. At this time, the trench may be formed to extend from the second conductivity-type semiconductor layer 104 to a portion of the support substrate 119.

Figure 1H:
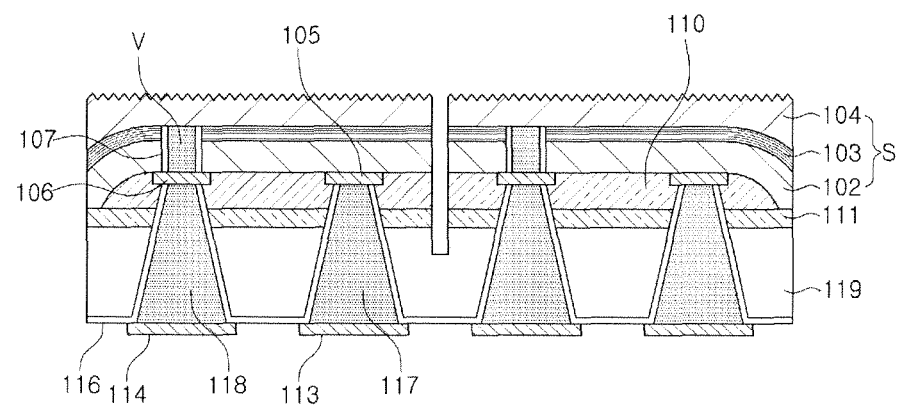

With reference to FIG. 1H, an uneven structure may be formed on the second conductivity-type semiconductor layer 104, thereby further improving light extraction efficiency. According to exemplary embodiments, the uneven structure may be formed by wet-etching the second conductivity-type semiconductor layer 104 after the growth substrate 101 is separated from the light emitting structure S and is removed.

Figure 1I:
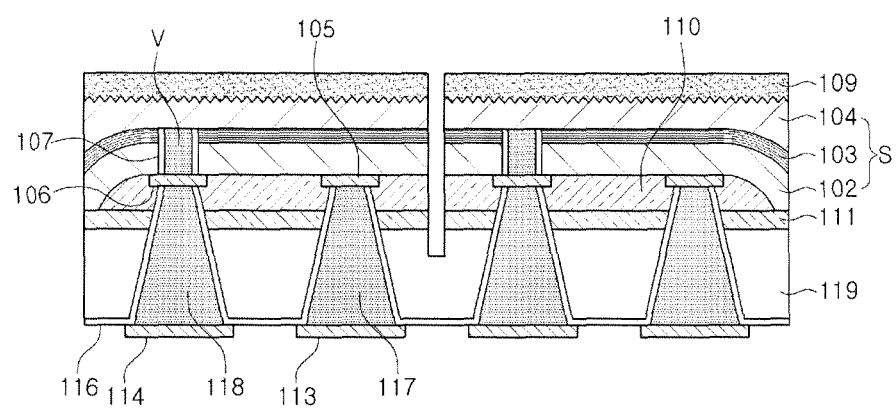

With reference to FIG. 1I, a wavelength conversion layer 109 may be formed on the light emitting structure S. The wavelength conversion layer 109 may include a phosphor excited by light emitted from the light emitting structure S to emit light having a different wavelength. By combining the light emitted by the phosphor with the light emitted by the light emitting structure S, desired output light such as white light or the like may be obtained.

The wavelength conversion layer 109 may be formed of oxide-based, silicate-based, nitride-based, and sulfide-based phosphor mixtures, and the like. In a case of the oxide-based material, (Y, Lu, Se, La, Gd, Sm)$_3$ (Ga, Al)$_5$O$_{12}$: Ce, as yellow and green phosphors, and BaMgAl$_{10}$O$_{17}$: Eu, 3Sr$_3$(PO$_4$)$_2$.CaCl Eu, as blue phosphors, and the like, may be used; and in a case of the silicate-based material, (Ba, Sr)$_2$SiO$_4$:Eu, as yellow and green phosphors, (Ba, Sr)$_3$SiO$_5$: Eu, as yellow and orange phosphors, and the like, may be used. In addition, in a case of the nitride-based material, β-SiAlON:Eu, as a green phosphor, (La, Gd, Lu, Y, Sc)$_3$Si$_6$N$_{11}$:Ce, as a yellow phosphor, α-SiAlON:Eu, as an orange phosphor, (Sr, Ca)AlSiN$_3$:Eu, (Sr, Ca)AlSi(ON)$_3$:Eu, (Sr, Ca)$_2$Si$_5$N$_8$:Eu, (Sr, Ca)$_2$Si$_5$(ON)$_8$:Eu, (Sr, Ba)SiAl$_4$N$_7$: Eu, as red phosphors, and the like, may be used; and, in a case of the sulfide-based material, (Sr, Ca)S:Eu, (Y, Gd)$_2$O$_2$S:Eu, as red phosphors, SrGa$_2$S$_4$:Eu, as a green phosphor, and the like, may be used.

Phosphor compositions in the wavelength conversion layer 109 should basically conform to stoichiometry, and respective elements of the phosphor compositions may be substituted with different elements of the groups on the periodic table, to which the respective elements of the phosphor compositions belong. For example, strontium (Sr) may be substituted with barium (Ba), calcium (Ca), magnesium (Mg), or the like, of alkaline earth metals (Group 2), and yttrium (Y) may be substituted with terbium (Tb), lutetium (Lu), scandium (Sc), gadolinium (Gd), or the like, of lanthanoids. Also, europium (Eu), an activator, may be substituted with cerium (Ce), terbium (Tb), praseodymium (Pr), erbium (Er), ytterbium (Yb), or the like, according to a desired energy level. An activator may be used alone, or a coactivator, or the like, may be additionally used to change light emitting characteristics. In addition, materials such as quantum dots (QDs), or the like, may be used as a substitute for phosphors, and in LEDs, phosphors and quantum dots may be used alone or in combination. A quantum dot may have a structure including a core (3 nm to 10 nm) such as CdSe, InP, or the like, a shell (0.5 nm to 2 nm) such as ZnS, ZnSe, or the like, and a ligand for stabilizing the core and the shell, and may create various colors according to size. The applications of the phosphors and quantum dots may be performed using at least one of a spraying method, a film forming method, and a method of attaching a film or a sheet formed of a ceramic phosphor.

Figure 6A:
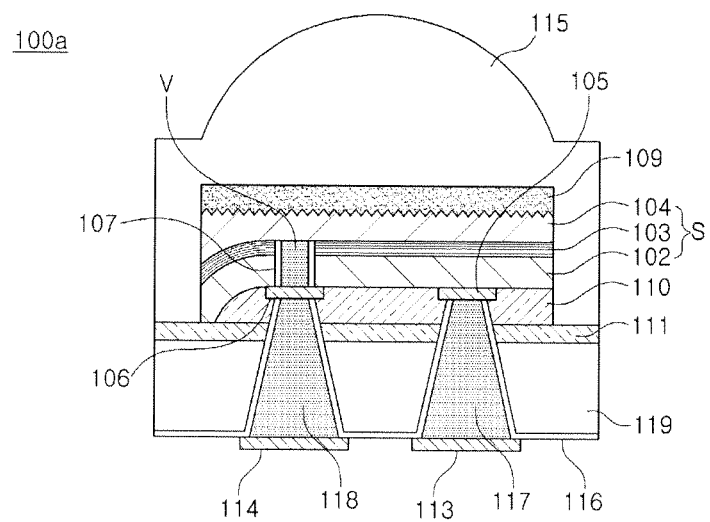
FIGS. 6A through 6E are cross-sectional views of light emitting device packages manufactured using methods of manufacturing a light emitting device package according to exemplary embodiments in the present disclosure.

Thereafter, with reference to FIG. 1I together with FIGS. 6A-6E, a lens part 115 may seal the light emitting structure S and light emitting device packages 100a, 100b, 100c, 100d, and 100e may be isolated from each other. Such an isolation process may be performed by blade cutting or laser cutting. FIG. 6A schematically illustrates the light emitting device package 100a manufactured through the aforementioned processes.

Here, the lens part 115 may be formed to have a dome structure of which an upper surface is convex as illustrated in FIG. 6A, but is not limited thereto. An angle of light emitted through the upper surface of the lens part 115 may be adjusted. The lens part 115 may be supported by the second bonding layer 111, and may be formed to have a certain shape on the light emitting structure S and the wavelength conversion layer 109 and may be cured. The lens part 115 may be formed of a resin having high transparency allowing light generated in the light emitting structure S to pass therethrough with a minimum loss. For example, elastic resin, silicon, epoxy resin, or plastic may be used.

The lens part 115 may be formed by attaching a previously formed lens, or injecting a fluidal organic solvent into a mold in which the light emitting structure S is disposed and solidifying the same, or the like. Since light distribution is changed according to shapes (concave, convex, uneven, conic, or geometric structures) of the lens part 115, the shape of the lens part 115 may be changed to satisfy desired efficiency and light distribution.

FIGS. 2A through 2D are views illustrating some processes in a method of manufacturing a light emitting device package according to an exemplary embodiment in the present disclosure. The same processes as those illustrated in FIGS. 1A through 1C may be performed prior to a process illustrated in FIG. 2A.

Figure 2A:
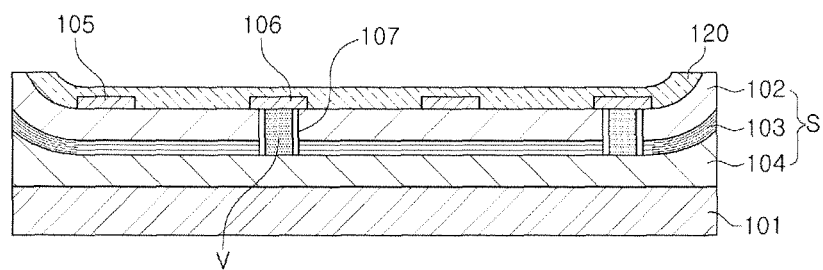
FIGS. 2A through 2D are views illustrating a method of manufacturing a light emitting device package according to an exemplary embodiment in the present disclosure.

With reference to FIG. 2A, after a first bonding layer 120 is formed and polished or planarized, an upper surface of the first bonding layer 120 may not be flat despite the planarization. That is, a portion of the upper surface of the first bonding layer 120 may be higher than the remainder of the upper surface of the first bonding layer 120. When the support substrate 119 is bonded thereto, the relatively lower portion of the upper surface of the first bonding layer 120 may become a non-bonded region, which is not bonded to the support substrate 119, forming a void.

Figure 2B:
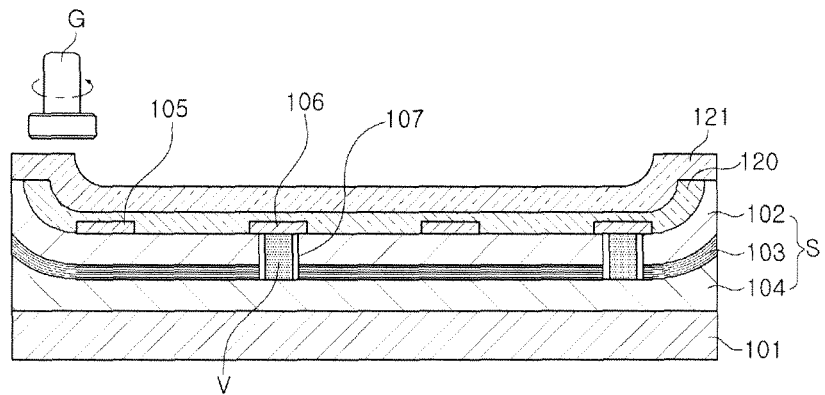

With reference to FIG. 2B, in order to prevent the non-bonded region from being formed, a second bonding layer 121 may be formed on the first bonding layer 120 and may be polished.

Figure 2C:
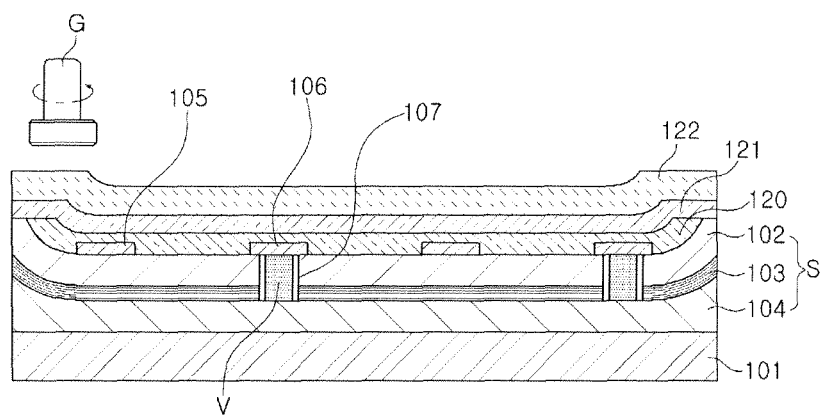

With reference to FIG. 2C, a third bonding layer 122 may be formed on the second bonding layer 121 and may be polished.

Even after the polishing process illustrated in FIG. 2B, an upper surface of the second bonding layer 121 may not be flat. That is, a portion of the upper surface of the second bonding layer 121 may be higher than the remainder of the upper surface of the second bonding layer 121. In this case, a void may be formed as described above. Therefore, in order to prevent such a non-bonded region from being formed, a third bonding layer 122 may be formed on the second bonding layer 121 and may be polished.

Figure 2D:
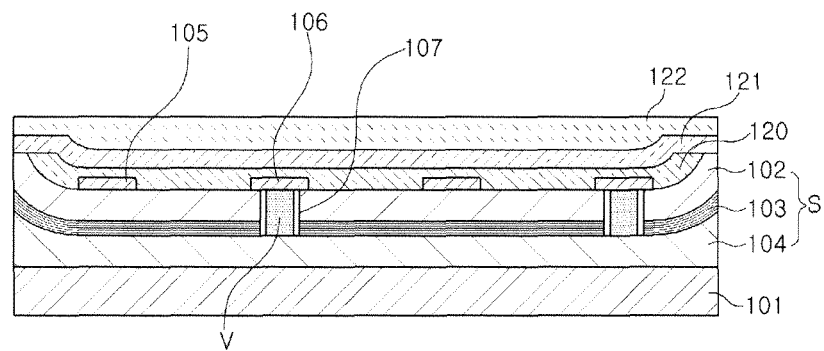

With reference to FIG. 2D, after the polishing process illustrated in FIG. 2C, an upper surface of the third bonding layer 122 may be flattened. If not, the process of FIG. 2C may be performed at least once more. That is, a further bonding layer may be formed on the third bonding layer 122 and may be polished. The process of FIG. 2C may be repeatedly performed until an upper surface of a final bonding layer among the plurality of bonding layers is flattened.

Figure 6B:
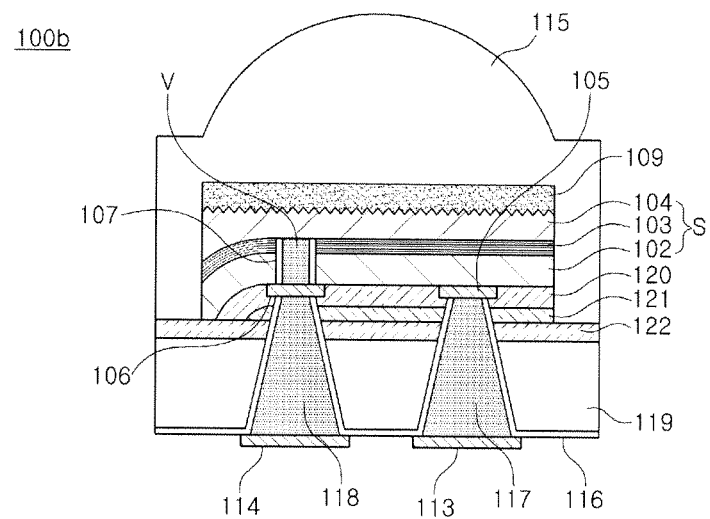

Thereafter, the same processes as those illustrated in FIGS. 1F through 1I may be subsequently performed after the process of FIG. 2D. Then, as described with reference to FIG. 6A, the isolation process of the light emitting device packages and the process of forming the lens part 115 may be performed. FIG. 6B schematically illustrates the light emitting device package 100b manufactured through the aforementioned subsequent processes.

FIGS. 3A through 3D are views illustrating some processes in a method of manufacturing a light emitting device package according to an exemplary embodiment in the present disclosure. A method of forming the light emitting structure S and a method of forming the first and second electrodes 105 and 106 in FIG. 3A may be the same as those illustrated in FIGS. 1A and 1B.

Figure 3A:
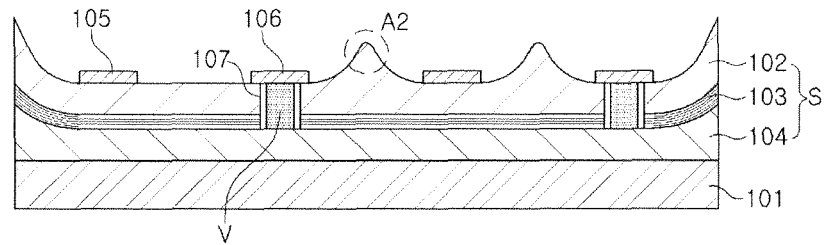
FIGS. 3A through 3D are views illustrating a method of manufacturing a light emitting device package according to an exemplary embodiment in the present disclosure.

With reference to FIG. 3A, a plurality of protrusions A2 may be formed as non-planar regions on the upper surface of the light emitting structure S. The protrusions A2 may be formed when portions of the upper surface of the first conductivity-type semiconductor layer 102 are abnormally grown. When a semiconductor wafer is used as the growth substrate 101, an overgrowth region A1 (see FIG. 1A) of the light emitting structure S may also be present at an edge of the wafer.

Figure 3B:
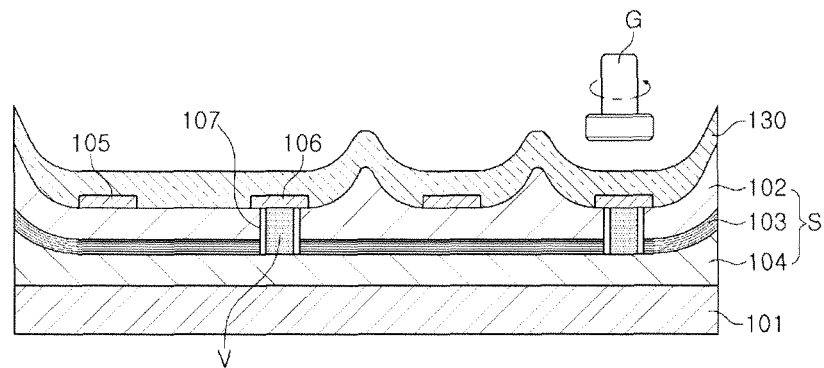

With reference to FIG. 3B, a first bonding layer 130 may be formed on the upper surface of the light emitting structure S and may be polished. At this time, an upper surface of the first bonding layer 130 may be formed to have a shape corresponding to that of the upper surface of the light emitting structure S on which the protrusions A2 are formed.

Figure 3C:
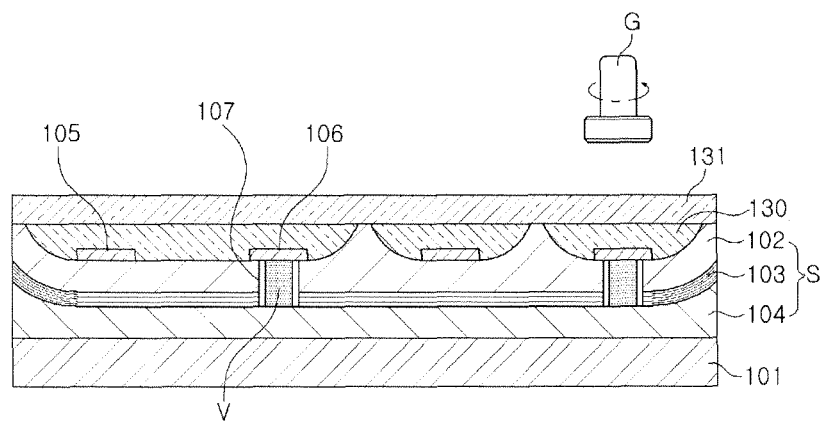

With reference to FIG. 3C, a second bonding layer 131 may be formed on the first bonding layer 130 and may be polished.

In the polishing of the first bonding layer 130, portions of the overgrowth region A1 (see FIG. 1A) and the protrusions A2 may be exposed outside (or through) the first bonding layer 130. At this time, the upper surface of the first bonding layer 130 and the exposed portions of the protrusions A2 may be substantially coplanar. As described above, the exposed portions may become non-bonded portions in a subsequent process, thereby forming voids. Next, a second bonding layer 131 may be formed on the first bonding layer 130 and may be polished.

Figure 3D:
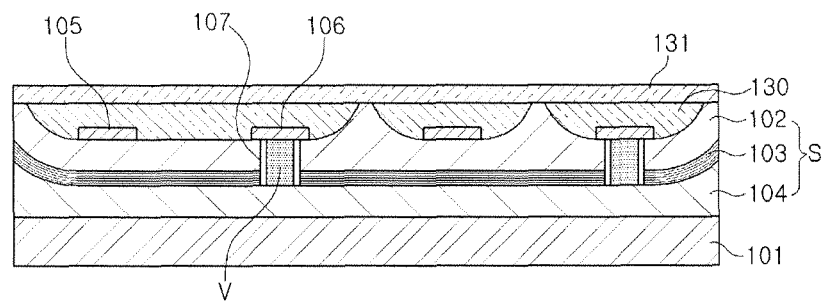

With reference to FIG. 3D, after the polishing of the second bonding layer 131, the exposed portions of the protrusions A2 and the first bonding layer 130 may be entirely covered with the flattened second bonding layer 131.

Figure 6C:
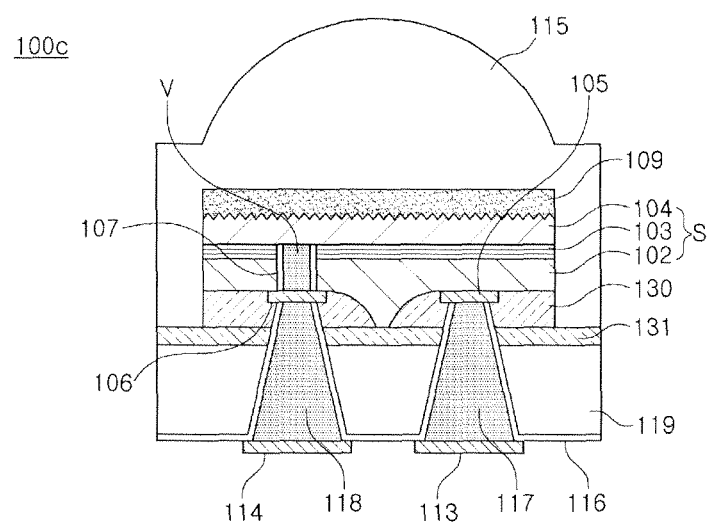

Thereafter, the same processes as those illustrated in FIGS. 1F through 1I may be subsequently performed after the process of FIG. 3D. Then, the isolation process of the light emitting device packages and the process of forming the lens part 115 may be performed, which are the same as those illustrated in FIGS. 6A-6E. FIG. 6C schematically illustrates the light emitting device package 100c manufactured through the aforementioned subsequent processes.

FIGS. 4A through 4D are views illustrating some processes in a method of manufacturing a light emitting device package according to an exemplary embodiment in the present disclosure. A method of forming the light emitting structure Sand a method of forming the first and second electrodes 105 and 106 in FIG. 4A may be the same as those illustrated in FIGS. 1A and 1B.

Figure 4A:
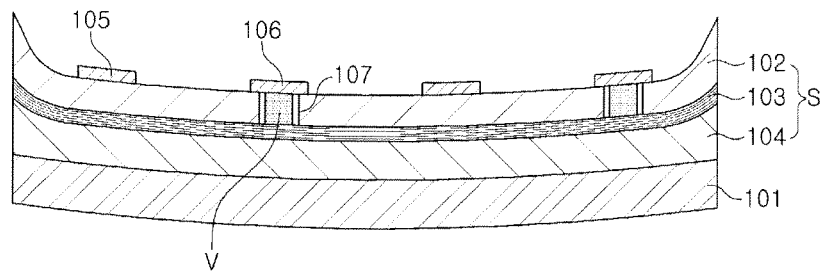
FIGS. 4A through 4D are views illustrating a method of manufacturing a light emitting device package according to an exemplary embodiment in the present disclosure.

With reference to FIG. 4A, the growth substrate 101 on which the light emitting structure S is formed may be warped. Such warpage may cause the light emitting structure S to have a bowed surface that is concave in a direction toward the first conductivity-type semiconductor layer 102. When a semiconductor wafer is used as the growth substrate 101, an overgrowth region A1 (see FIG. 1A) of the light emitting structure S may also be present at an edge of the wafer. When the growth substrate 101 is warped or bowed in the direction toward the first conductivity-type semiconductor layer 102, the overgrowth region A1 of the light emitting structure (see FIG. 1A) may be protruded further than when the growth substrate 101 is not warped. Accordingly, a non-bonded region may be more likely to be formed after a bonding layer is flattened.

Figure 4B:
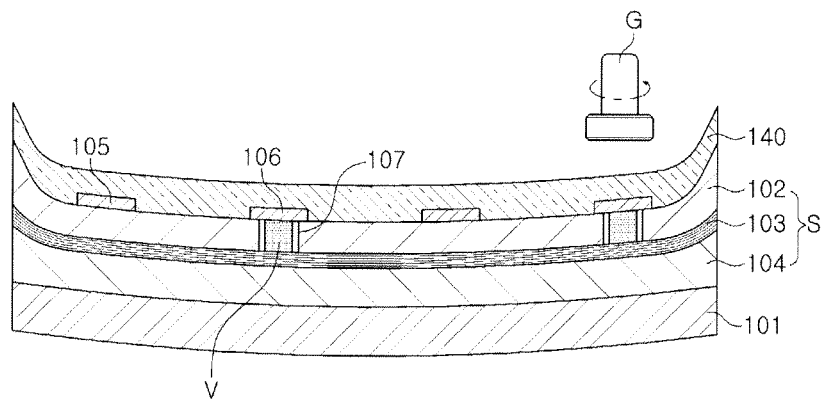

With reference to FIG. 4B, a first bonding layer 140 may be formed on the upper surface of the light emitting structure S and may be polished. At this time, an upper surface of the first bonding layer 140 may be formed to have a shape corresponding to that of the upper surface of the light emitting structure S, such as a warped or bowed surface.

Figure 4C:
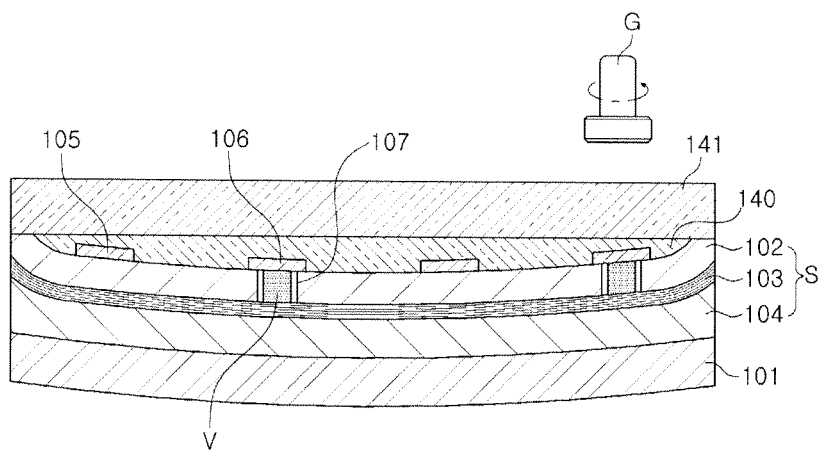

With reference to FIG. 4C, after the polishing of the first bonding layer 140, a portion of the non-planar region of the light emitting structure S may be exposed outside the polished first bonding layer 140. At this time, the upper surface of the first bonding layer 140 and the exposed portion of the non-planar region may be substantially coplanar. Next, a second bonding layer 141 may be formed on the first bonding layer 140 and may be polished.

Figure 4D:
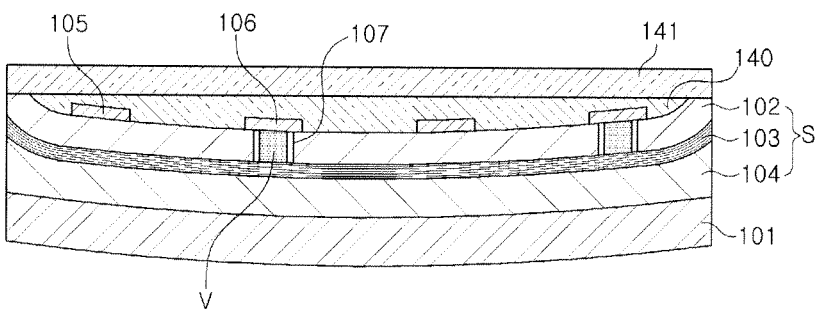

With reference to FIG. 4D, the polished first bonding layer 140 and the non-planar region may be entirely covered with the second bonding layer 141.

Figure 6D:
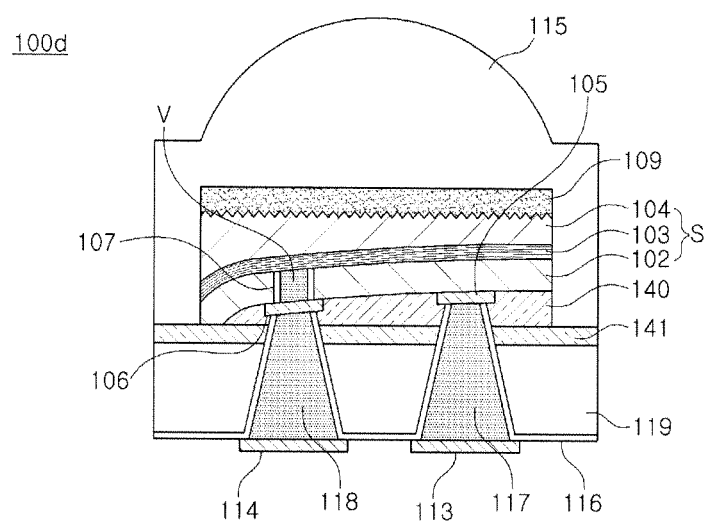

Thereafter, the same processes as those illustrated in FIGS. 1F through 1I may be subsequently performed after the process of FIG. 4D. Then, the isolation process of the light emitting device packages and the process of forming the lens part 115 may be performed, which are the same as those illustrated in FIG. 6A. FIG. 6D schematically illustrates the light emitting device package 100d manufactured through the aforementioned subsequent processes.

FIGS. 5A through 5D are views illustrating some processes in a method of manufacturing a light emitting device package according to an exemplary embodiment in the present disclosure. A method of forming the light emitting structure S and a method of forming the first and second electrodes 105 and 106 in FIG. 5A may be the same as those illustrated in FIGS. 1A and 1B.

Figure 5A:
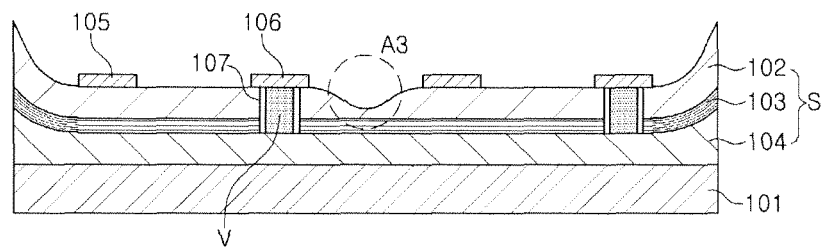
FIGS. 5A through 5D are views illustrating a method of manufacturing a light emitting device package according to an exemplary embodiment in the present disclosure.

With reference to FIG. 5A, a recess A3 may be formed as a non-planar region in the upper surface of the light emitting structure S. When a semiconductor wafer is used as the growth substrate 101, an overgrowth region A1 (see FIG. 1A) of the light emitting structure S may also be present at an edge of the wafer.

Figure 5B:
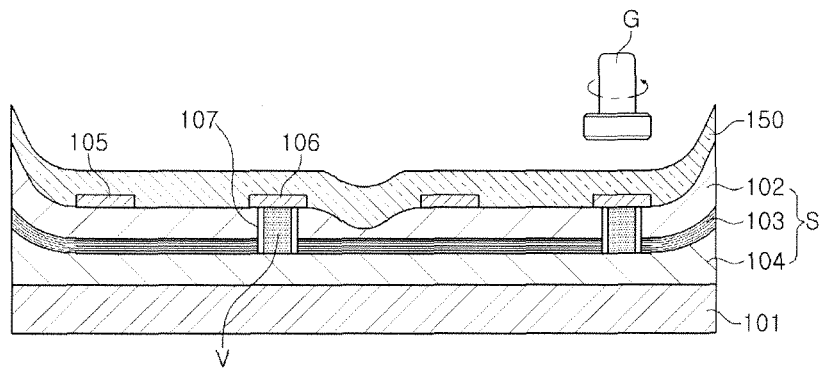

With reference to FIG. 5B, a first bonding layer 150 may be formed on the upper surface of the light emitting structure S and may be polished. At this time, a portion of an upper surface of the first bonding layer 150 corresponding to the recess A3 may be recessed.

Figure 5C:
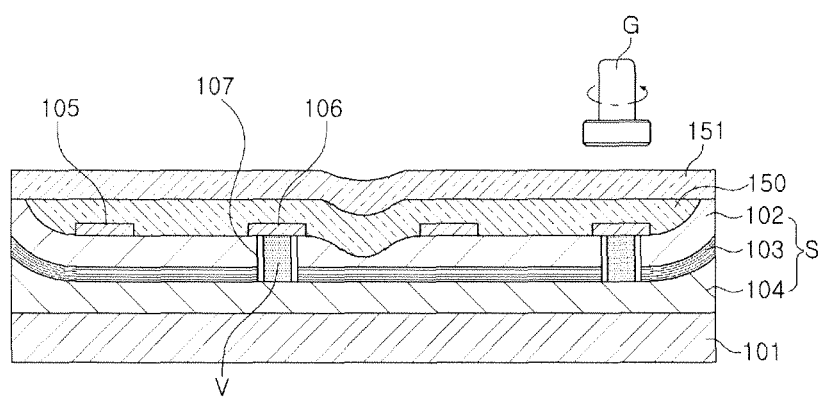

With reference to FIG. 5C, a second bonding layer 151 may be formed on the upper surface of the first bonding layer 150 and may be polished. At this time, a portion of an upper surface of the second bonding layer 151 corresponding to the recessed portion of the first bonding layer 150 may be recessed. Thereafter, the second bonding layer 151 may be polished.

Figure 5D:
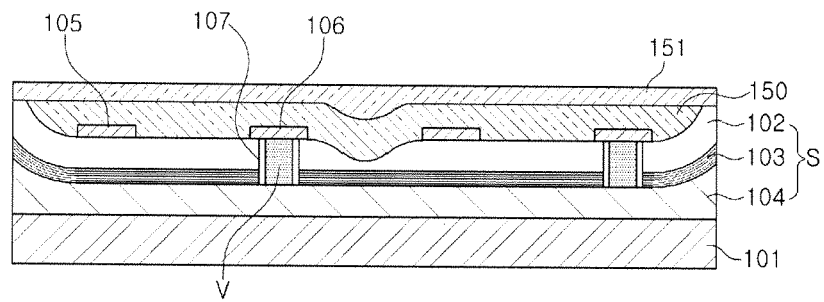

With reference to FIG. 5D, the upper surface of the second bonding layer 151 may be flattened (e.g., through polishing). If not, a process of forming and polishing another bonding layer may be repeatedly performed until an upper surface of a last bonding layer among the plurality of bonding layers formed on the light emitting structure S is flattened.

Figure 6E:
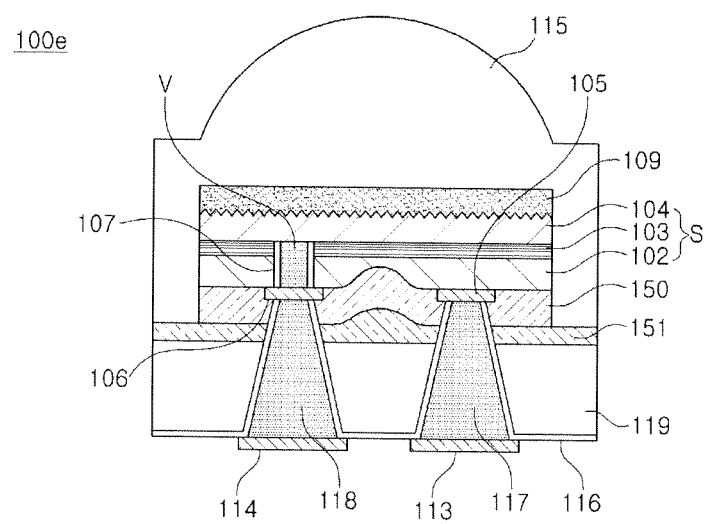

Thereafter, the same processes as those illustrated in FIGS. 1F through 1I may be subsequently performed after the process of FIG. 5D. Then, the isolation process of the light emitting device packages and the process of forming the lens part 115 may be performed, which are the same as those illustrated in FIG. 6A. FIG. 6E schematically illustrates the light emitting device package 100e manufactured through the aforementioned subsequent processes.

FIGS. 6A through 6E are cross-sectional views of the light emitting device packages 100a, 100b, 100c, 100d, and 100e manufactured using methods of manufacturing a light emitting device package according to exemplary embodiments in the present disclosure. The light emitting device packages 100a, 100b, 100c, 100d, and 100e may be chip scale packages (CSPs) or wafer level packages (WLPs).

The light emitting device packages 100a, 100b, 100c, 100d, and 100e are manufactured using the methods described above with reference to FIGS. 1A through 1I, FIGS. 2A through 2D, FIGS. 3A through 3D, FIGS. 4A through 4D, and FIGS. 5A through 5D, respectively. The light emitting device package 100a of FIG. 6A includes the non-planar region, i.e., the overgrowth region A1 (see FIG. 1A) of the light emitting structure S at the edge thereof. The light emitting device packages 100b, 100c, 100d, and 100e are characterized by including the three bonding layers formed on the light emitting structure S; including the plurality of protrusions A2 (see FIG. 3A) formed on the upper surface of the light emitting structure S; having the growth substrate 101, on which the light emitting structure S is formed, warped; and including the recess A3 (see FIG. 5A) in the upper surface of the light emitting structure, respectively.

Figure 7:
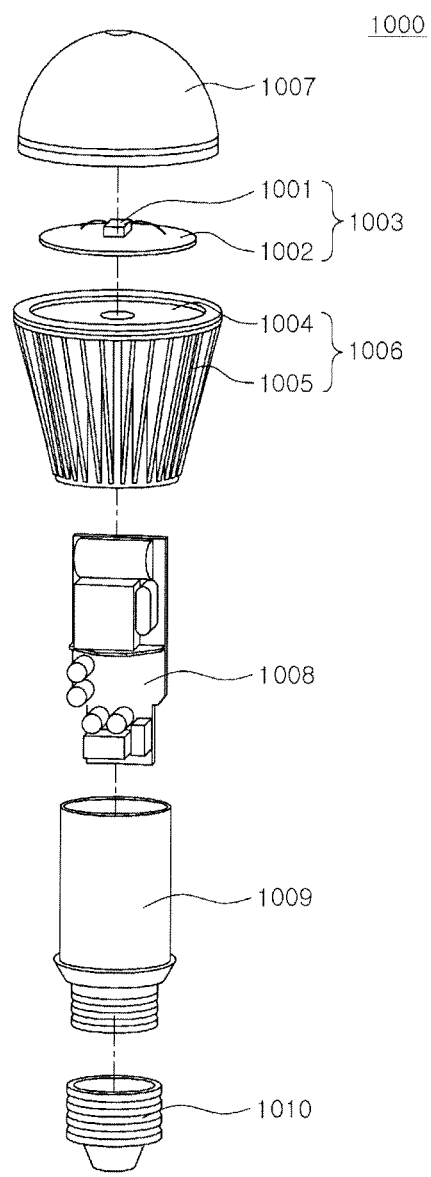
FIG. 7 illustrates an example of a lighting device to which a light emitting device package manufactured using a method of manufacturing a light emitting device package according to an exemplary embodiment in the present disclosure is applied.

FIG. 7 illustrates an example of a lighting device to which the light emitting device package 100a, 100b, 100c, 100d, or 100e manufactured using a method of manufacturing a light emitting device package according to an exemplary embodiment in the present disclosure is applied.

With reference to an exploded perspective view of FIG. 7, a lighting device 1000 is illustrated, for example, as a bulb-type lamp, and includes a light emitting module 1003, a driver 1008, and an external connector 1010. In addition, the lighting device 1000 may further include exterior structures such as external and internal housings 1006 and 1009, a cover 1007, and the like. The light emitting module 1003 may include a light source 1001 and a circuit board 1002 on which the light source 1001 is mounted. The light source 1001 may be anyone of the light emitting device packages 100a, 100b, 100c, 100d, and 100e illustrated in FIGS. 6A through 6E. In the present exemplary embodiment, a single light source 1001 is mounted on the circuit board 1002 by way of example; however, a plurality of light sources may be mounted thereon as necessary. In this case, the plurality of light sources 1001 may be homogeneous light sources that generate light having the same wavelength. Alternatively, the plurality of light sources 1001 may include heterogeneous light sources that generate light having different wavelengths. For example, the light sources 1001 may include a light emitting device emitting white light by combining a blue LED with a yellow, green, red, or orange phosphor and at least one of violet, blue, green, red, and infrared light emitting devices. In this case, a color rendering index (CRI) of the lighting device 1000 may be adjusted in a range from that of a sodium lamp to that of sunlight, and a color temperature thereof may be adjusted in a range from 1500K to 12000K, whereby the lighting device 1000 may generate white light having various characteristics. If necessary, the lighting device 1000 may generate visible light of violet, blue, green, red, and orange color or infrared light, thereby adjusting light color according to a surrounding environment or a user's mood. In addition, the lighting device 1000 may generate light having a particular wavelength that may stimulate plant growth.

The white light generated by combining the blue LED with at least one of yellow, green, and red phosphors and/or at least one of green and red light emitting devices may have two or more peak wavelengths, and (x,y) coordinates thereof may be positioned within an area surrounded by vertices (0.4476, 0.4074), (0.3484, 0.3516), (0.3101, 0.3162), (0.3128, 0.3292), and (0.3333, 0.3333) based on the CIE 1931 chromaticity diagram. Alternatively, the (x,y) coordinates may be positioned within an area surrounded by the aforementioned area and a blackbody radiation spectrum. The color temperature of the white light may range from 2000K to 20000K.

In addition, the light emitting module 1003 of the lighting device 1000 may include the external housing 1006 serving as a heat radiator, and the external housing 1006 may include heat sinks 1004 and 1005 directly contacting the light emitting module 1003 to improve heat dissipation. In addition, the lighting device 1000 may include the cover 1007 disposed above the light emitting module 1003 and having a convex lens shape. The driver 1008 may be disposed inside the internal housing 1009 and may be connected to the external connector 1010 such as a socket structure to receive power from an external power source. In addition, the driver 1008 may convert the received power into power appropriate for driving the light source 1001 of the light emitting module 1003 and supply the converted power thereto. For example, the driver 1008 may be configured as an AC-DC converter, a rectifying circuit part, or the like.

Figure 8:
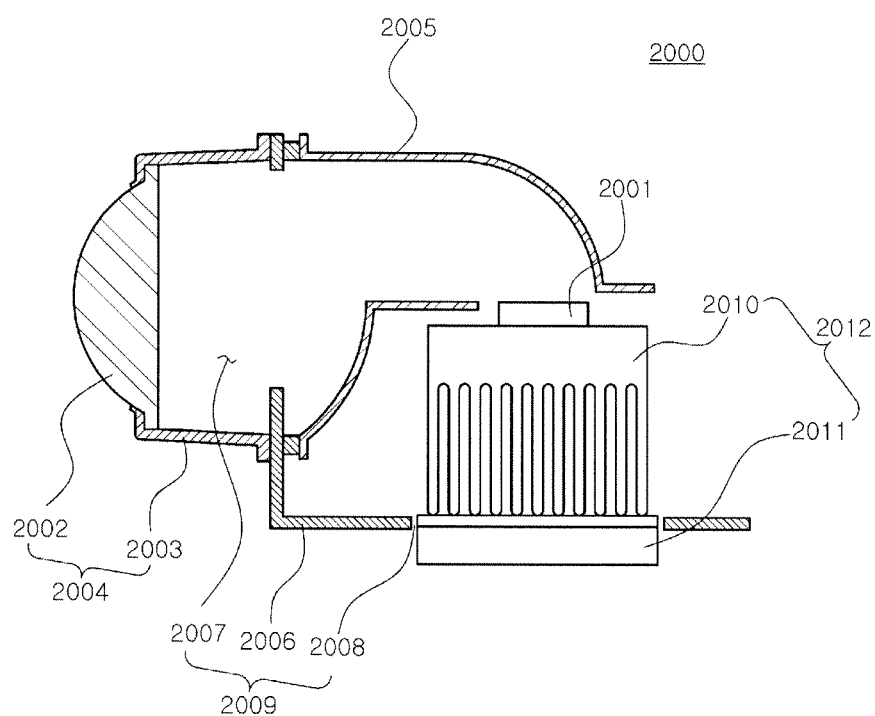
FIG. 8 illustrates an example of a headlamp to which a light emitting device package manufactured using a method of manufacturing a light emitting device package according to an exemplary embodiment in the present disclosure is applied.

FIG. 8 illustrates an example of a headlamp to which the light emitting device package 100a, 100b, 100c, 100d, or 100e manufactured using a method of manufacturing a light emitting device package according to an exemplary embodiment in the present disclosure is applied.

With reference to FIG. 8, a headlamp 2000 used in a vehicle or the like may include a light source 2001, a reflector 2005, and a lens cover 2004, and the lens cover 2004 may include a hollow guide part 2003 and a lens 2002. The light source 2001 may be any one of the light emitting device packages 100a, 100b, 100c, 100d, and 100e illustrated in FIGS. 6A through 6E. In addition, the headlamp 2000 may further include a heat radiator 2012 dissipating heat generated by the light source 2001 outwardly. The heat radiator 2012 may include a heat sink 2010 and a cooling fan 2011 in order to effectively dissipate heat. In addition, the headlamp 2000 may further include a housing 2009 allowing the heat radiator 2012 and the reflector 2005 to be fixed thereto and supported thereby. The housing 2009 may include a support part 2006 and a central hole 2008 formed in one surface thereof, to which the heat radiator 2012 is coupled. In addition, the housing 2009 may include a forwardly open hole 2007 formed in the other surface thereof integrally connected to one surface thereof and bent in a direction perpendicular thereto. The reflector 2005 may be fixed to the housing 2009, such that light generated by the light source 2001 may be reflected by the reflector 2005, pass through the forwardly open hole 2007, and be emitted outwardly.

As set forth above, according to exemplary embodiments of the present disclosure, a method of manufacturing a light emitting device package capable of suppressing the generation of a void due to a non-bonded region at the time of bonding a light emitting structure and a support substrate to one another, and accordingly, production yield may be improved in a subsequent packaging process.

While exemplary embodiments have been shown and described above, it will be apparent to those skilled in the art that modifications and variations could be made without departing from the scope of the present invention as defined by the appended claims.

What is claimed is:

1. A method comprising:
forming a first bonding layer on a first surface of a light emitting structure including a first conductivity-type semiconductor layer, an active layer, and a second conductivity-type semiconductor layer stacked in a first direction, the first surface having at least one of a recess and protrusion, and an electrode on the first surface;
planarizing a surface of the first bonding layer; and
forming a second bonding layer on the first bonding layer to cover the first bonding layer, wherein a portion of the first bonding layer extends along the first and second electrodes in the first direction.

2. The method of claim 1, wherein:
planarizing the surface of the first bonding layer includes planarizing the surface of the first bonding layer to expose at least a portion of the first surface of the light emitting structure having the recess or protrusion through the planarized surface of the first bonding layer, and
forming the second bonding layer includes forming the second bonding layer on the planarized surface of the first bonding layer to cover the first bonding layer and the exposed portion of the first surface of the light emitting structure.

3. The method of claim 2, further comprising:
planarizing a surface of the second bonding layer,
wherein no portion of the light emitting structure is exposed through the planarized surface of the second bonding layer.

4. The method of claim 2, further comprising:
planarizing a surface of the second bonding layer; and
upon determining that the planarized surface of the second bonding layer includes at least one of a recess and a protrusion, forming a third bonding layer on the planarized surface of the second bonding layer to compensate for the at least one recess and protrusion in the surface of the second bonding layer.

5. The method of claim 1, wherein planarizing the surface of the first bonding layer includes polishing the surface of the first bonding layer through chemical mechanical polishing (CMP).

6. The method of claim 1, further comprising:
bonding a support substrate to the second bonding layer; and
following bonding the support substrate, removing a growth substrate attached to the light emitting structure.

7. The method of claim 6, further comprising:
forming one or more through holes to penetrate through the support substrate and the first and second bonding layers;
forming an insulating layer to extend from perimeters of the through holes to a lower surface of the support substrate in the through holes; and
applying a conductive material to the insulating layer extending in the through holes to form an electrical connection to the first or second conductivity-type semiconductor layer.

8. The method of claim 7, further comprising:
forming a wavelength conversion layer on the second conductivity-type semiconductor layer of the light emitting structure; and
forming a lens part on the wavelength conversion layer, wherein the lens part has a first surface contacting the wavelength conversion layer and a second surface that is opposite to the first surface and is convex.

9. A method comprising:
forming a first bonding layer on a first surface of a light emitting structure including a first conductivity-type semiconductor layer, an active layer, and a second conductivity-type semiconductor layer stacked in a first direction, and an electrode on the first surface;
planarizing a surface of the first bonding layer; and
forming a second bonding layer on the planarized surface of the first bonding layer to cover the first bonding layer, wherein a portion of the first bonding layer extends along the electrode in the first direction.

10. The method of claim 9, wherein:
a surface of the light emitting structure having the first bonding layer formed thereon has irregularities, and
the first bonding layer fills the irregularities in the surface of the light emitting structure.

11. The method of claim 10, wherein the irregularities include at least one of an overgrowth region of the light emitting structure, a protrusion in the surface of the light emitting structure, and a recess in the surface of the light emitting structure.

12. The method of claim 10, wherein:
planarizing the surface of the first bonding layer includes planarizing the surface to expose at least one irregularity in the surface of the light emitting structure, and
forming the second bonding layer includes forming the second bonding layer on the first bonding layer to cover the first bonding layer and the exposed irregularity in the light emitting structure.

13. The method of claim 9, wherein:
a growth substrate having the light emitting structure thereon is warped,
forming the first bonding layer includes forming the first bonding layer to have a first surface contacting a warped surface of the light emitting structure, and
planarizing the first bonding layer includes planarizing a second surface of the first bonding layer opposite to the first surface to have a substantially flat surface.

14. The method of claim 9, further comprising:
bonding a support substrate to the second bonding layer;
forming one or more through holes to penetrate through the support substrate and the first and second bonding layers at locations of the one or more conductive electrodes;
forming an insulating layer to extend from perimeters of the through holes to a lower surface of the support substrate in the through holes; and
applying a conductive material to the insulating layer extending in the through holes to form electrical connections to the one or more conductive electrodes.

15. The method of claim 9, wherein the second bonding layers is formed of a same material as the first bonding layer.

16. The method of claim 9, wherein the second bonding layer is formed of a different material than the first bonding layer.

17. A light emitting device package comprising:
a light emitting structure including a first conductivity-type semiconductor layer, an active layer, and a second conductivity-type semiconductor layer stacked in a first direction;
an electrode on the light emitting structure;
a first bonding layer on the light emitting structure and the electrode; and
a second bonding layer on the first bonding layer, wherein a portion of the first bonding layer extends along the electrode in the first direction.

18. The light emitting device package of claim 17, wherein:
a surface of the light emitting structure having the first bonding layer disposed thereon has irregularities, and
the first bonding layer fills the irregularities in the surface of the light emitting structure.

19. The light emitting device package of claim 18, wherein:
one or more irregularities in the surface of the light emitting structure extend through the first bonding layer, and
the second bonding layer is on the first bonding layer so as to contact the one or more irregularities in the surface of the light emitting structure that extend through the first bonding layer.

* * * * *